(12) United States Patent
Zeng et al.

(10) Patent No.: US 10,579,855 B2
(45) Date of Patent: Mar. 3, 2020

(54) DISPLAY PANEL AND ELECTRONIC DEVICE

(71) Applicant: SHANGHAI TIANMA MICRO-ELECTRONICS CO., LTD., Shanghai (CN)

(72) Inventors: Yang Zeng, Shanghai (CN); Jun Ma, Xiamen (CN); Qing Zhang, Shanghai (CN); Lihua Wang, Shanghai (CN); Liang Xie, Shanghai (CN); Hong Ding, Shanghai (CN); Lingxiao Du, Shanghai (CN); Huiping Chai, Shanghai (CN); Kang Yang, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 59 days.

(21) Appl. No.: 15/875,273

(22) Filed: Jan. 19, 2018

(65) Prior Publication Data

US 2018/0158877 A1 Jun. 7, 2018

(30) Foreign Application Priority Data

Sep. 15, 2017 (CN) .......................... 2017 1 0834879

(51) Int. Cl.
*G06K 9/00* (2006.01)
*H01L 27/32* (2006.01)
(Continued)

(52) U.S. Cl.
CPC ......... *G06K 9/0004* (2013.01); *G06F 3/0412* (2013.01); *G06F 3/0421* (2013.01);
(Continued)

(58) Field of Classification Search
CPC ... G06F 3/0412; G06F 3/0421; G06K 9/0004; G06K 9/0008; G06K 9/2018;
(Continued)

(56) References Cited

U.S. PATENT DOCUMENTS 10,283,578 B2 * 5/2019 Ka ..................... H01L 27/3262
2004/0252867 A1 * 12/2004 Lan ..................... G06K 9/0004
382/124
(Continued)

FOREIGN PATENT DOCUMENTS

CN 101598864 A 12/2009

*Primary Examiner* — Dmitriy Bolotin
(74) *Attorney, Agent, or Firm* — Alston & Bird LLP

(57) ABSTRACT

Disclosed are a display panel and an electronic device. In a fingerprint recognition stage, at least one of the first and second organic light-emitting structures function as a light source of the fingerprint recognition unit; the emergent light of the at least one of the first and second organic light-emitting structures has a first spectral range, the transmission spectral range of the first color filter film is a second spectral range, and the spectral range corresponding to visible light and near-infrared light is a third spectral range. The first spectral range is located within the second spectral range which is located within the third spectral range, light from at least a part of the wave band located within the third spectral range and outside the second spectral range is absorbed or reflected by the first color filter film.

20 Claims, 18 Drawing Sheets

(51) Int. Cl.
*G06F 3/041* (2006.01)
*G06K 9/20* (2006.01)
*G06F 3/042* (2006.01)

(52) U.S. Cl.
CPC ........... *G06K 9/209* (2013.01); *G06K 9/2018* (2013.01); *H01L 27/323* (2013.01); *H01L 27/3211* (2013.01); *H01L 27/3234* (2013.01); *H01L 27/3246* (2013.01); *G06K 9/0008* (2013.01); *H01L 27/322* (2013.01)

(58) Field of Classification Search
CPC ... G06K 9/209; H01L 27/3211; H01L 27/322; H01L 27/323; H01L 27/3234; H01L 27/3246
See application file for complete search history.

(56) References Cited

U.S. PATENT DOCUMENTS

| | | | |
|---|---|---|---|
| 2017/0032169 A1* | 2/2017 | Pi | G06K 9/00026 |
| 2017/0124370 A1* | 5/2017 | He | G06K 9/0012 |
| 2017/0220838 A1* | 8/2017 | He | G06K 9/0004 |
| 2017/0270342 A1* | 9/2017 | He | G06F 3/0412 |
| 2018/0005003 A1* | 1/2018 | Ryu | G01B 7/004 |
| 2018/0005005 A1* | 1/2018 | He | G06F 3/0412 |
| 2018/0012069 A1* | 1/2018 | Chung | A61B 5/1172 |

* cited by examiner

DISPLAY PANEL AND ELECTRONIC DEVICE

CROSS-REFERENCE TO RELATED APPLICATIONS

This application claims priority to Chinese Patent Application No. CN201710834879.3, filed on Sep. 15, 2017 and entitled "DISPLAY PANEL AND ELECTRONIC DEVICE", the disclosure of which is incorporated herein by reference in its entirety.

TECHNICAL FIELD

The present disclosure relates to the field of display technologies, and in particular, to a display panel and an electronic device.

BACKGROUND

Fingerprinting is inherent and unique to everyone. With the development of sciences and technologies, a variety of display devices with fingerprint recognition function, such as mobile phones, tablet computers and smart wearable devices, etc., exists on the market. In this way, before operating such display device with the fingerprint recognition function, a user only needs to touch a specific region of the display device with his finger, and authority verification can be achieved through the recognition of the fingerprint recognition unit, thereby simplifying the authority verification process. In accordance with the principle of operation, the fingerprint recognition may include light-sensitive fingerprint recognition and ultrasonic fingerprint recognition, etc.

Fingerprints consist of a series of ridges and valleys located on the skin surface of the fingertip. For light-sensitive fingerprint recognition, the intensities of the light reflected by the ridges and valleys received by the fingerprint recognition unit are different so that the current/voltage signal converted from the reflected light formed at the ridge positions and the current/voltage signal converted from the reflected light formed at the valley positions are different in magnitude, and the fingerprint recognition can then be performed based on the size of the current/voltage signals. The fingerprint recognition unit generally includes a photo-diode and a storage capacitor, wherein the photodiode and the storage capacitor collectively convert the light reflected via the touch body into a current/voltage signal. However, due to the presence of ambient light (sunlight or light, etc.), the accuracy of the detection result of the fingerprint recognition is reduced.

SUMMARY

The embodiments of the present invention provides a display panel and an electronic device so as to reduce the adverse effects of ambient light, and improve the accuracy of the detection result of the fingerprint recognition.

In a first aspect, an embodiment of the present invention provides a display panel, including: an array substrate, comprising a base substrate; a plurality of organic light-emitting structures located on a side of the array substrate. The organic light-emitting structures include a first organic light-emitting structure, a second organic light-emitting structure and a third organic light-emitting structure; a fingerprint recognition unit, configured to perform fingerprint recognition according to the light reflected via a touch body to the fingerprint recognition unit. The fingerprint recognition unit has a photosensitive surface, and an orientation of the photosensitive surface of the fingerprint recognition unit is the same as an orientation of a display surface of the display panel. A first color filter film located on the photosensitive surface of the fingerprint recognition unit. The light reflected via the touch body reaches the fingerprint recognition unit after passing through the first color filter film. In the fingerprint recognition stage, at least one of the first organic light-emitting structure and the second organic light-emitting structure function as a light source of the fingerprint recognition unit. The emitted light of at least one of the first organic light-emitting structure and the second organic light-emitting structure has a first spectral range, a transmission spectral range of the first color filter film is defined as a second spectral range, and a spectral range corresponding to visible light and near-infrared light is defined as a third spectral range. The first spectral range is located within the second spectral range, and the second spectral range is located within the third spectral range. At least a part of the wave band of the light located within the third spectral range and outside the second spectral range is absorbed or reflected by the first color filter film.

In a second aspect, an electronic device is provided by an embodiment of the present invention, which includes the display panel according to in the first aspect.

The display panel provided by the present disclosure includes a plurality of organic light-emitting structures, a fingerprint recognition unit, and a first color filter film. The organic light-emitting structures include a first organic light-emitting structure, a second organic light-emitting structure and a third organic light-emitting structure. The fingerprint recognition unit can achieve the fingerprint recognition according to the intensity of the light (that is, fingerprint signal light) reflected via the touch body (finger fingerprint). In the fingerprint recognition stage, the first organic light-emitting structure and/or the second organic light-emitting structure function as the light source of fingerprint recognition unit, thereby simplifying the arrangement of the light source of the fingerprint recognition unit. The light emitted by the light source of the fingerprint recognition unit has the first spectral range, and the transmission spectral range of the first color filter film is defined as the second spectral range. The first spectral range is located within the second spectral range. Therefore, most of the emergent light emitted by the light source of the fingerprint recognition unit can pass through the first color filter film. In addition, the wave band in the ambient light (such as sunlight or light) that adversely affects the fingerprint recognition is mainly distributed in the visible light wave band and the near-infrared light wave band, wherein the visible light and the near-infrared light have the third spectral range. In the present disclosure, the first color filter film is provided to absorb or reflect the light of at least a part of the wave band that is located within the third spectral range and outside the second spectral range, thus reducing the light intensity of the ambient light irradiated to the fingerprint recognition unit, reducing the adverse effect of the ambient light, and hence improving the accuracy of the detection result of the fingerprint recognition.

DETAILED DESCRIPTION

The present disclosure will be further described in detail below with reference to the accompanying drawings and embodiments. It can be understood that the specific embodiments described herein are only used to explain the present disclosure rather than to limit the present disclosure. In addition, it should also be noted that, for the convenience of description, only some but not all structures related to the present disclosure are shown in the accompanying drawings.

Figure 1:
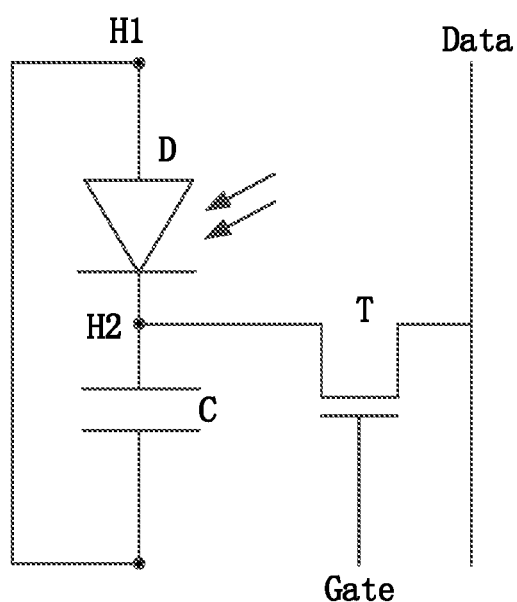
FIG. 1 is a schematic diagram circuit of a fingerprint recognition unit according to an embodiment of the present invention.

FIG. 1 is a schematic diagram of a circuit structure of a fingerprint recognition unit according to an embodiment of the present invention. Referring to FIG. 1, a fingerprint recognition unit circuit includes a photodiode D, a storage capacitor C, and a thin film transistor T. An anode of the photodiode D is electrically connected to a first electrode plate of the storage capacitor C, and a cathode of the photodiode D is electrically connected to a second electrode plate of the storage capacitor C and a source electrode of the thin film transistor T. A gate electrode of the thin film transistor T is electrically connected to a switch control line Gate, and a drain electrode of the thin film transistor T is electrically connected to a signal line Data. The photodiode D is used to convert light reflected by a touch body into a current signal. For the sake of clarity, fingerprint recognition principle is described in detail with reference to FIG. 1. In the fingerprint recognition stage, a low voltage signal (for example, a constant voltage signal of −5 V in magnitude) is input to a node H1, and a high voltage signal (for example, a constant voltage signal of 1.5 V in magnitude) is input to the signal line Data. The entire fingerprint recognition stage includes a preparation stage, a fingerprint signal acquisition stage and a fingerprint signal detection stage. In the preparation stage, the driving chip (not shown) electrically connected to the fingerprint recognition unit controls the thin film transistor T of the fingerprint recognition unit to be turned on by the switch control line Gate, so that the storage capacitor C is charged until the storage capacitor C is charged completely. In the fingerprint signal acquisition stage, the thin film transistor T of the fingerprint recognition unit is controlled to be turned off by using the switch control line Gate. When the user presses a finger on the display panel, the light emitted by the the light source of the fingerprint recognition (for example, the light-emitting unit) is irradiated onto the finger and reflected on the surface of the finger fingerprint to form the reflected light. The reflected light formed by finger fingerprint reflection is incident into the fingerprint recognition unit and is received by the photodiode D of the fingerprint recognition unit, so as to form photocurrent which is directed from the node H2 to the node H1, thereby causing the potential of node H2 to change. In the fingerprint signal detection stage, the change in the potential of the node H2 can be directly detected to determine the size of the photocurrent. The reflected light reflected by the finger fingerprint is irradiated onto the photodiode D to form the photocurrent. In the fingerprint signal acquisition stage, the storage capacitor C is discharged according to the size of the photocurrent. The more light is irradiated, the more discharge there would be. If the light intensity of the ambient light incident onto the fingerprint recognition unit is relatively large, the charge in the storage capacitor C would be depleted, so that the size of the photocurrent cannot correctly represent the intensity of the light reflected by the finger fingerprint, causing the fingerprinting recognition unit to have a risk of fingerprint detection errors and hence reducing the accuracy of the detection result of fingerprinting recognition.

Figure 2:
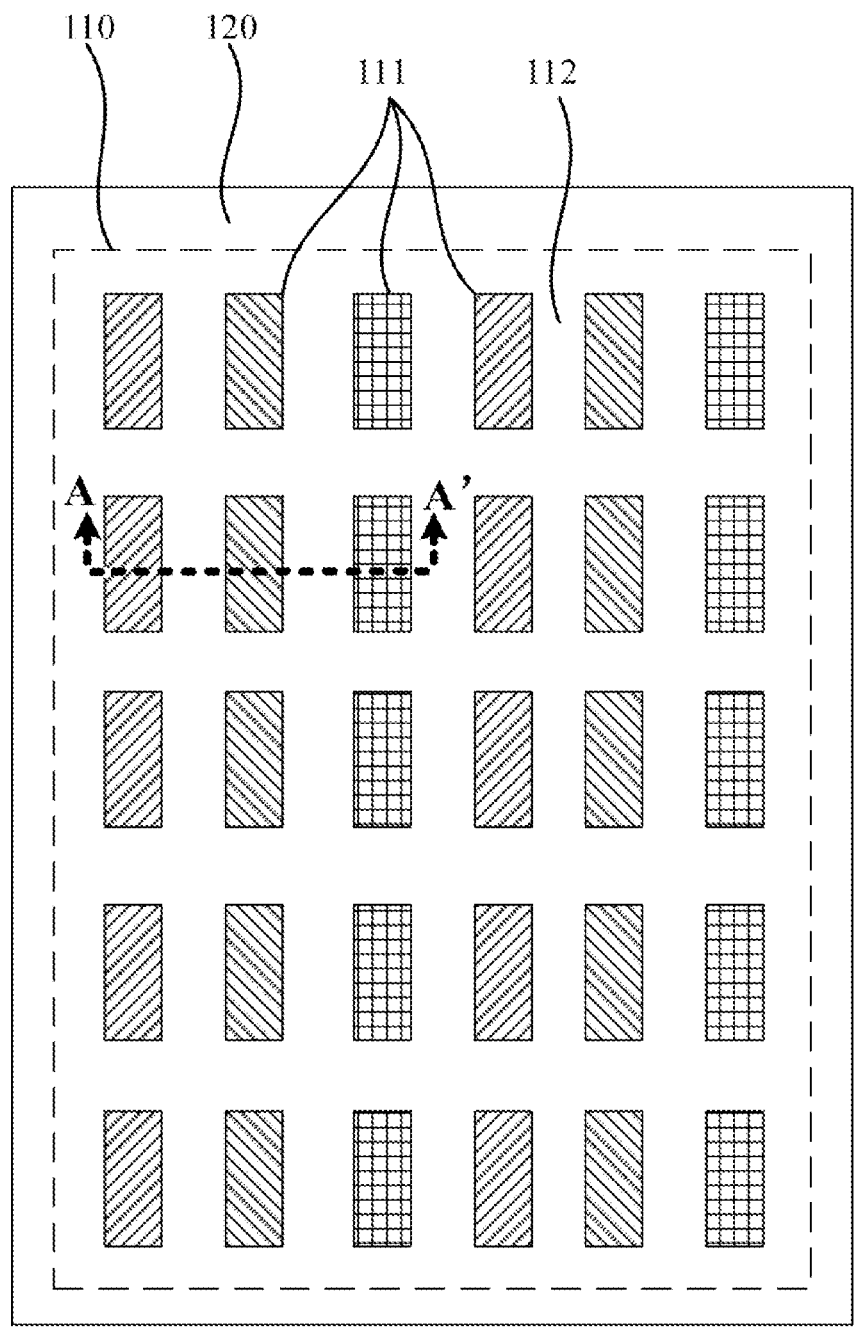
FIG. 2 is a top view showing the structure of a display panel according to an embodiment of the present invention.
Figure 3:
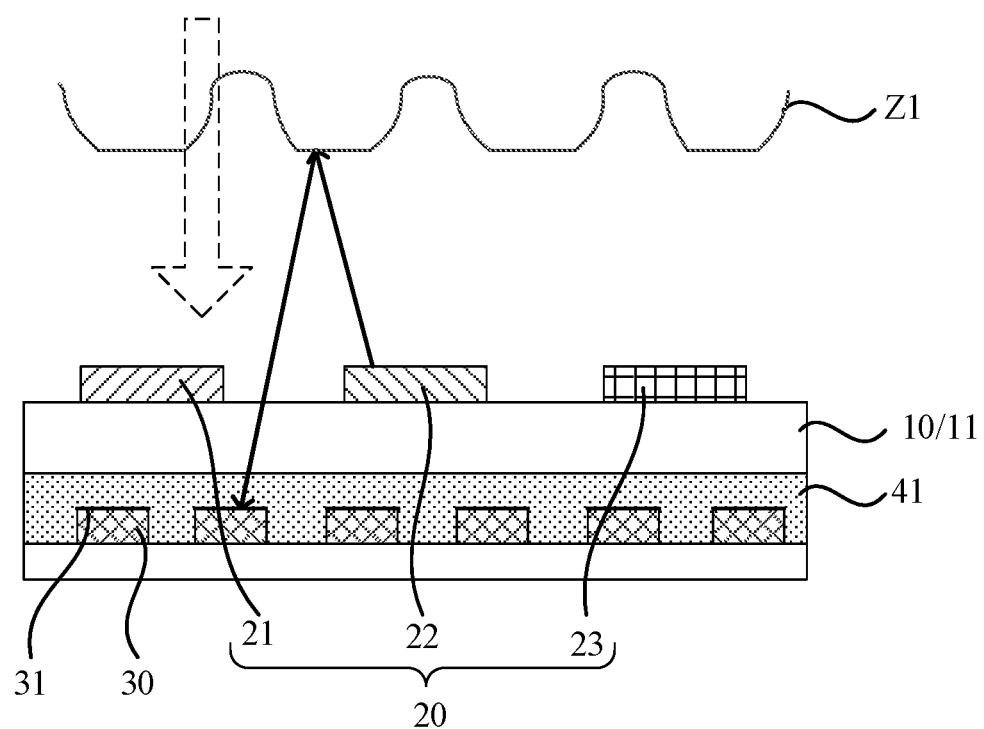
FIG. 3 is a schematic cross sectional view along AA' direction in FIG. 2.

FIG. 2 is a top view showing the structure of a display panel according to an embodiment of the present invention, and FIG. 3 is a schematic cross sectional view along AA' direction in FIG. 2. In combination with FIG. 2 and FIG. 3, the display panel includes a display region 110 and a surrounding region 120 surrounding display region 110. The display region 110 includes an opening region 111 and an opening-free region 112. The opening region 111 is a region where the organic light-emitting structure 20 is located. The display panel provided by an embodiment of the present disclosure includes an array substrate 10, a plurality of organic light-emitting structures 20, a fingerprint recognition unit 30, and a first color filter film 41, wherein the array substrate 10 also includes a base substrate 11. The plurality of organic light-emitting structures 20 are located on a side of the array substrate 10, wherein the organic light-emitting structures 20 include a first organic light-emitting structure 21, a second organic light-emitting structure 22, and a third organic light-emitting structure 23. The fingerprint recognition unit 30 is configured to perform fingerprint recognition according to the light reflected via the touch body Z1 (finger fingerprint) to the fingerprint recognition unit 30, wherein the fingerprint recognition unit 30 has a photosensitive surface 31, and an orientation of the photosensitive surface 31 of the fingerprint recognition unit 30 is the same as an orientation of a display surface of the display panel. That is, the photosensitive surface 31 is located on a surface of the fingerprint recognition unit 30 close to the touch body Z1. The first color filter film 41 is located on the photosensitive surface 31 of the fingerprint recognition unit 30, wherein the light reflected via the touch body Z1 reaches the fingerprint recognition unit 30 after passing through the first color filter film 41. The first color filter film 41 has band-pass filtering effect, which may be made of light-absorbing material, in order to for example pass one or more wave bands of the light there through and absorb out-of-band light (That is, the band of the light other than the above-mentioned one or more wave bands of the light). For another example, the color filter film 41 may be formed with a structure that selectively reflects a specific wave band of the light, and it can pass one or more wave bands of the light there through and reflects all other out-of-band light. In the fingerprint recognition stage, the first organic light-emitting structure 21 and/or the second organic light-emitting structure 22 function as the light source of the fingerprint recognition unit 30. An emergent light of the first organic light-emitting structure 21 and/or the second organic light-emitting structure 22 before passing the first color filter 41 has a first spectral range, the transmitted spectral range of the first color filter film 41 is defined as a second spectral range, and a spectral range corresponding to visible light and near-infrared light is defined as a third spectral range, and wherein the first spectral range is located within the second spectral range, the second spectral range is located within the third spectral range, and at least a part of the wave band of the light (as indicated by a dashed arrow in FIG. 3) located within the third spectral range and outside the second spectral range is absorbed or reflected by the first color filter film 41. The reflection here refers to that when the ambient light shown by the dashed arrow in FIG. 3 is radiated to the display panel, at least part of the wave band of the ambient light within the third spectral range and outside the second spectral range is transmitted in an opposite direction to the dashed arrow after reflected by the first color filter film, so that it cannot reach the fingerprint recognition unit 30.

Figure 4:
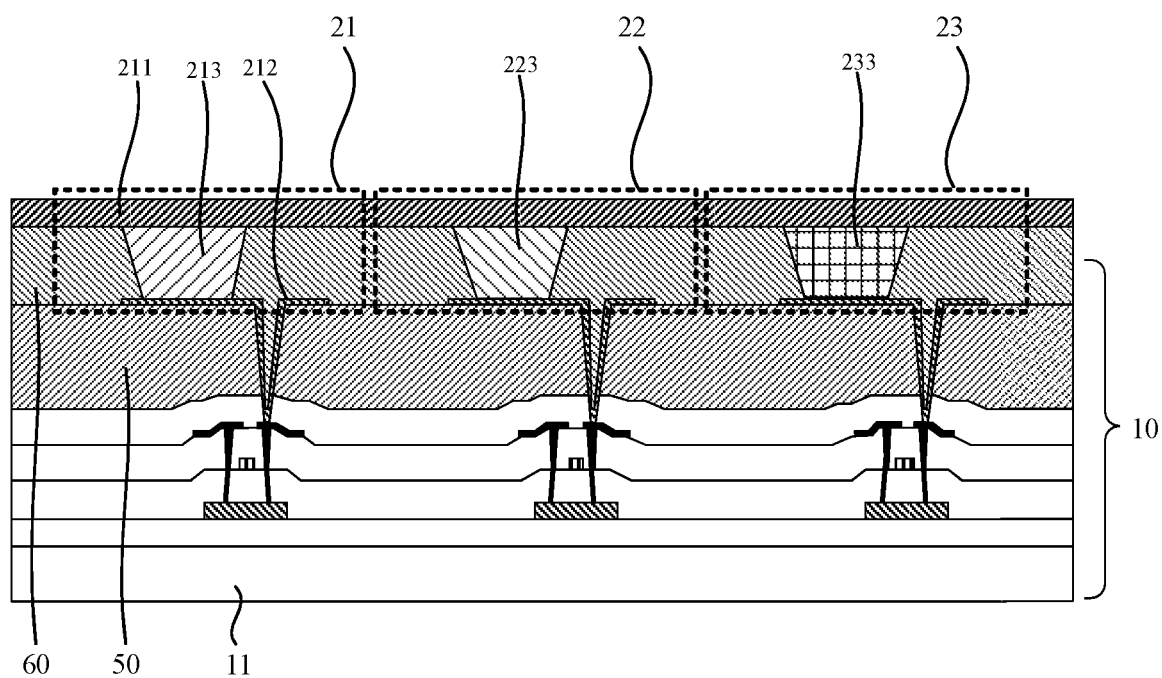
FIG. 4 is a schematic cross sectional view of another display panel according to an embodiment of the present invention.

FIG. 4 is a schematic cross sectional view of another display panel according to an embodiment of the present invention. Referring to FIGS. 3 and 4, the array substrate 10 includes a base substrate 11, a thin film transistor array layer, a planarization layer 50 and a pixel defining layer 60 that is sequentially provided. The base substrate may provide a supporting function for other film layers in the display panel, and the base substrate 11 may be a rigid substrate or a flexible substrate. The rigid substrate may be, for example, a glass substrate, the flexible substrate may be, for example, a substrate formed of polyimide. The thin film transistor array layer includes a plurality of thin film transistors, the thin film transistors are correspondingly connected to the organic light-emitting structure 20 to provide an electrical signal to the organic light-emitting structure 20 and drive the organic light-emitting structure 20 to emit light. The planarization layer 50 covers the thin film transistor array layer for providing a planar surface for the organic light-emitting structure 20, wherein the planarization layer 50 is generally made of organic material. The pixel defining layer 60 is located on a side of the planarization layer 50 away from the base substrate 11, and the pixel defining layer 60 forms a plurality of grooves, wherein the organic light-emitting structure 20 is located in the groove of the pixel defining layer 60, and the pixel defining layer 60 is used for spacing the multiple organic light-emitting structure 20. Specifically, the organic light-emitting structure 20 includes a first electrode 211, a second electrode 212, and an organic light-emitting layer located between the first electrode 211 and the second electrode 212. According to different organic light-emitting layers, the organic light-emitting structures 20 include a first organic light-emitting structure 21, a second organic light-emitting structure 22 and a third organic light-emitting structure 23. Specifically, the first organic light-emitting structure 21 includes a first organic light-emitting layer 213, the second organic light-emitting structure 22 includes a second organic light-emitting layer 223, and the third organic light-emitting structure 23 includes a third organic light-emitting layer 233. In one embodiment, the first electrode 211 is a cathode and the second electrode 212 is an anode. Under the action of an external electric field, electrons and holes are injected into the organic light-emitting layer from the cathode and the anode, respectively, so as to migrate, recombine and attenuate in the organic light-emitting layer to emit light. The first organic light-emitting structure 21 emits a first color light, the second organic light-emitting structure 22 emits a second color light, and the third organic light-emitting structure 23 emits a third color light. When the display panel displays, the first organic light-emitting structure 21, the second organic light-emitting structure 22 and the third organic light-emitting structure 23 emit light according to the display signal to form a display picture.

Because the fingerprint recognition unit needs to perform fingerprint recognition based on the intensity of the light reflected by the touch body, it is necessary to provide a light source for the fingerprint recognition unit. In the related art, a light source is generally separately provided on a side of the base substrate away from the organic light-emitting structure as the light source of the fingerprint recognition unit. Moreover, in order to prevent the light source for displaying screen and the external ambient light from affecting on the fingerprint recognition unit, the light emitted by the separately provided fingerprint recognition light source usually has a different light wave band than those of the light emitted by the light source used for the display picture and the ambient light. For example, the light emitted by the separately provided fingerprint recognition light source is infrared light, thus increasing the complexity of the separately provided fingerprint recognition light source. In an embodiment of the present invention, the organic light-emitting structure is reused as the light source of the fingerprint recognition unit. When the first organic light-emitting structure and/or the second organic light-emitting structure are reused as the light source of the fingerprint recognition unit, so that there is no need to additionally provide the light source of the fingerprint recognition unit, thereby simplifying the arrangement of the light source of the fingerprint recognition unit. After reflected via the touch body (finger fingerprint), the light emitted by the light source of the fingerprint recognition unit reach the fingerprint recognition unit through the first color filter film. At this time, the ambient light may also reach the fingerprint recognition unit after passing through the first color filter film. The light emitted by the light source of the fingerprint recognition unit has the first spectral range, and the transmission spectral range of the first color filter film is defined as the second spectral range, wherein the first spectral range is located within the second spectral range. Therefore, the emergent light emitted by the light source of the fingerprint recognition unit can pass through the first color filter film almost without loss. In addition, the wave band in the ambient light (sunlight or environmental light, etc.) that adversely affects fingerprint recognition is mainly distributed in the visible light band and near-infrared light band. The visible light and near-infrared light have the third spectral range. The first color filter film is capable of absorbing or reflecting light of at least part of the wave band that is located within the third spectral range and outside the second spectral range, thus reducing the light intensity of the ambient light irradiating to the fingerprint recognition unit, reducing the adverse effect of ambient light, and hence improving the accuracy of the detection result of the fingerprint recognition. For ease of understanding, for example, the transmission spectral range of the first color filter film is in a range from 590 nm to 620 nm, that is, the first color filter film can pass through light having a wavelength of 590 nm to 620 nm and absorb or reflect light having a wavelength outside 590 nm to 620 nm. It is assumed that the first organic light-emitting structure is used as a light source of the fingerprint recognition unit, the first organic light-emitting structure emits light having a wavelength of 600 nm to 610 nm, and after being reflected by the touch body, the intensity of the light reaching the first color filter film is 100. The emission wavelength of the first organic light-emitting structure is located within the transmission spectrum of the first color filter film, wherein the intensity of the light emitted by the first organic structure after passing through the first color filter film is 100. For example, the ambient light is sunlight, because the fingerprint recognition unit mainly responds to the visible light and the near-infrared light, and most energy of the sunlight is also concentrated in the visible light and the near-infrared light, the wavelength thereof is generally located between 380 nm to 2530 nm. Thus, only the visible light wave band and the near-infrared wave band in the sunlight may be considered. If the light intensity of the ambient light before reaching the first color filter film is 100, and only light having a wavelength of 590 nm-620 nm in visible light and near-infrared light can pass through the first color filter film, and the light having a wavelength of 380 nm-590 nm and 620 nm-2530 nm is absorbed or reflected by the first color filter film, then the intensity of the ambient light after passing through the first color filter film is 1.45. It can be seen that without the first color filter film, the light intensity reaching the fingerprint recognition unit is 200 (including the light intensity 100 emitted by the first organic light-emitting structure and the ambient light intensity 100), and thus the ambient light has a relatively large light intensity, so that the charge in the storage capacitor would be depleted, and hence the size of the photocurrent cannot correctly represent the light intensity reflected by the finger fingerprint. With the first color filter film provided in this embodiment, the light intensity reaching the fingerprint recognition unit is 101.45 (including the light intensity 100 emitted by the first organic light-emitting structure and ambient light intensity 1.45), and thus the ambient light has a relatively small light intensity, so that the size of the photocurrent can correctly represent the light intensity reflected by the finger fingerprint, thereby improving the accuracy of the detection result of the fingerprint recognition. It can be understood that the unit of light intensity is candela. For the sake of understanding, the light intensity given in the examples here is only represented by numerical value, and the magnitude of the numerical value is not the case in real products. It should be noted that for the transmission spectral range, it can be considered that the transmittance of incident light within the transmission spectral range of the first color filter film exceeds the first transmittance threshold, such as 60%, and the transmittance herein refers to the ratio of the intensity of emitted light after passing through the first color filter film to the intensity of light incident onto the first color filter film. The absorption or reflection of light outside the second spectral range by the first color filter film is also not a full absorption or reflection. It can be considered that the transmittance of the light passing through the first color filter film which is outside the second spectral range is lower than a second transmittance threshold, for example 40%.

In one embodiment, referring to FIG. 3, the fingerprint recognition unit 30 is located on a side of the base substrate 11 away from the plurality of organic light-emitting structures 20, light emitted by the organic light-emitting structure 20 that acts as a light source of the fingerprint recognition unit may be reflected by the touch body (finger fingerprint), wherein the fingerprint recognition unit 30 can achieve the fingerprint recognition according to the intensity of the light (that is, fingerprint signal light) reflected via the touch body (finger fingerprint). It can be understood that in this design, the base substrate is made of a transparent material and has a suitable thickness so that the base substrate has a certain supporting function, and also the light reflected by the touch body (finger fingerprint) can reach fingerprint recognition unit. The fingerprint recognition unit 30 is located on a side of the base substrate 11 away from the organic light-emitting structure 20. Therefore, the display panel having a fingerprint detection function can be formed by attaching a fingerprint recognizer having the fingerprint recognition unit 30 to the existing display panel. The fingerprint recognizer and the display panel without the fingerprint detection function can be made separately without changing the manufacturing process of the existing display panel. However, the present disclosure is not limited thereto. In other embodiments, the fingerprint recognition unit may be provided on a side of the base substrate close to the organic light-emitting structure.

Figure 5:
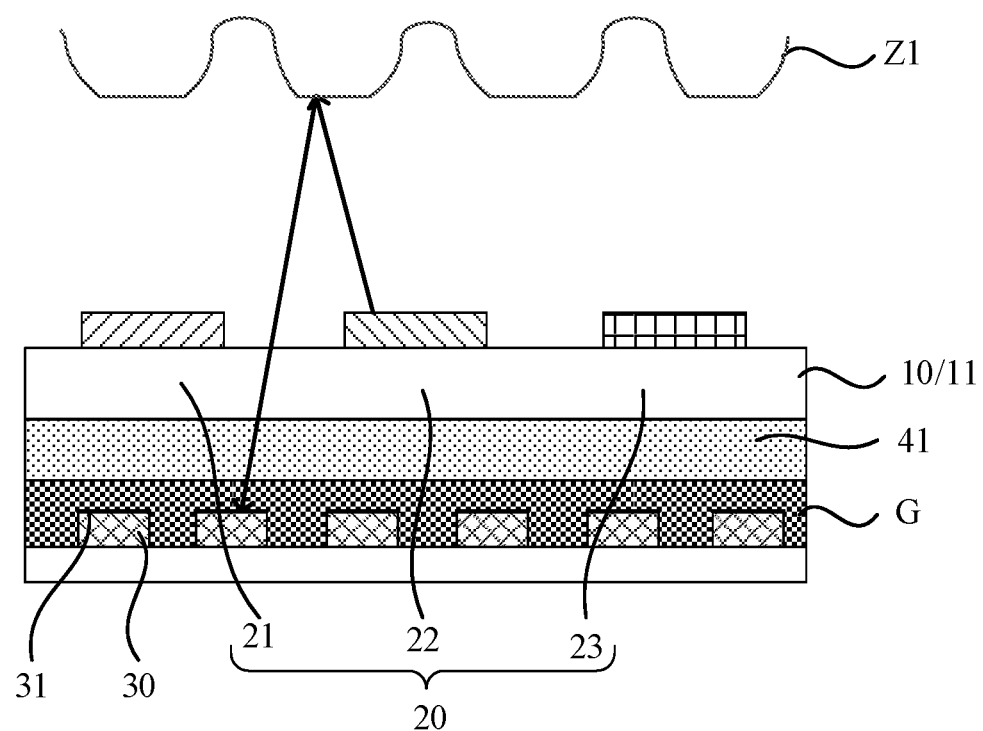
FIG. 5 is a schematic cross sectional view of another display panel according to an embodiment of the present invention.
Figure 6:
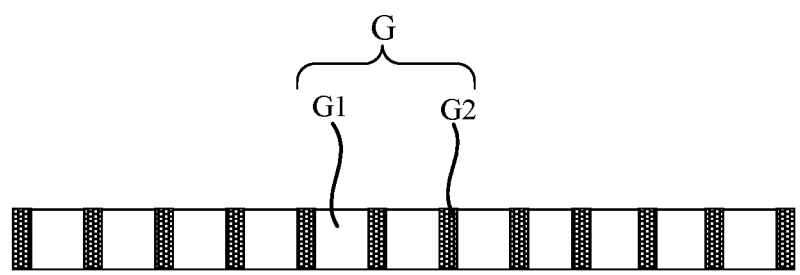
FIG. 6 is a structural representation of an optical imaging layer according to an embodiment of the present invention.

FIG. 5 is a schematic cross sectional view of another display panel according to an embodiment of the present invention, and FIG. 6 is a structural representation of an optical imaging layer according to an embodiment of the present invention. In combination with FIG. 5 and FIG. 6, in one embodiment, the display panel further includes an optical imaging layer G The optical imaging layer G is located between the base substrate 11 and the fingerprint recognition unit 30, and the optical imaging layer G covers the fingerprint recognition unit 30, that is, the projection of the fingerprint recognition unit 30 on the display panel is located within the projection of the optical imaging layer G on the display panel. The optical imaging layer G is used for imaging light reflected via the touch body Z1 onto the photosensitive surface 31. The optical imaging layer G may include light transmitting regions G1 and opaque regions G2, where the light transmitting regions G1 are arranged alternately with opaque regions G2. The opaque region G2 is provided with a light absorbing material. Therefore, for the light (large-angle light) exceeding a certain tilt angle (referring to the angle between the incident light direction and the direction perpendicular to the plane of the optical imaging layer), it would be absorbed by the light-absorbing material after it is irradiated to the opaque region G2, so that it cannot reach the photosensitive surface 31 of the fingerprint recognition unit 30, and thus the light reflected via the touch body Z1 and radiated to the fingerprint recognition unit 30 can be limited within a certain angle, thereby preventing the light reflected via different positions of the touch body from being irradiated onto the same fingerprint recognition unit, that is, avoiding the crosstalk phenomenon in the fingerprint recognition process. As for the arrangement of the optical imaging layer G provided between the first color filter film 41 and the fingerprint recognition unit 30, for example, the first color filter film 41 may be deposited directly on the optical imaging layer G, and then the optical imaging layer G deposited by the first color filter film 41 is attached to a side of the display panel having no fingerprint detection function, and then the fingerprint recognizer (including the plurality of fingerprint recognition units 30) is attached to a side of the optical imaging layer G having no first color filter film deposited. In this case, the first color filter film is not formed on the array substrate but formed on a separate optical imaging layer, so that the manufacturing process of the existing display panel is not changed.

The optical imaging layer G may also be a fiber optic panel. The fiber optic panel may include a plurality of optical fiber structures arranged in a same direction. An optical fiber structure include an inner core and a housing, and a light absorption material is provided between two adjacent optical fiber structures, so that the light between the two optical fiber structures which is passed through from one of the optical fiber structures can be absorbed by the light absorbing material between the two optical fiber structures, so as to filter the light beyond a certain inclination angle. It should be noted that the optical imaging layer of the display panel shown in FIG. 5 is located between the first color filter film and the fingerprint recognition unit, but the present disclosure is not limited thereto. In other embodiments, the first color filter film can be provided between the optical imaging layer and the fingerprint recognition unit.

In one embodiment, referring to FIG. 3, the first color filter film 41 is located between the plurality of organic light-emitting structures 20 and the fingerprint recognition unit 30. In the display stage, the first organic light-emitting structure 21, the second organic light-emitting structure 22 and the third organic light-emitting structure 23 can emit light for display, and the light can be emitted from a side of the organic light-emitting structure 20 away from the first color filter film 41. In the fingerprint recognition stage, after reflected via the touch body (finger fingerprint), light emitted by the light source of the fingerprint recognition unit reaches the fingerprint recognition unit after passing through the first color filter film. At this time, the ambient light may also reach the fingerprint recognition unit after passing through the first color filter film. The first color filter film has a selective transmission of light, and ambient light can be filtered by means of absorption or reflection, thus reducing or eliminating the impact of ambient light on fingerprint recognition. With this design, the first color filter film 41 does not affect the organic light-emitting structure 20 during the light-emitting display. Therefore, the shape and the position of the first color filter film 41 can be flexibly provided.

In one embodiment, referring to FIG. 3, the first color filter film 41 is located between the plurality of organic light-emitting structures 20 and the plurality of fingerprint recognition units 30, wherein the first color filter film 41 is a whole layer film, and the first color filter film 41 is provided to completely cover all the fingerprint recognition units 30, so that it can ensure that the ambient light contained in the light reaching each of the fingerprint recognition units 30 can be first filtered by the first color filter film 41, and therefore, the adverse impact of ambient light on fingerprint detection is further reduced. Meanwhile, the first color filter film is a complete whole layer film and hence, only a step of depositing the film layer is needed, without the need to pattern the film layer, so that the manufacturing process of the film layer is simplified and the manufacturing cost is reduced.

Figure 7:
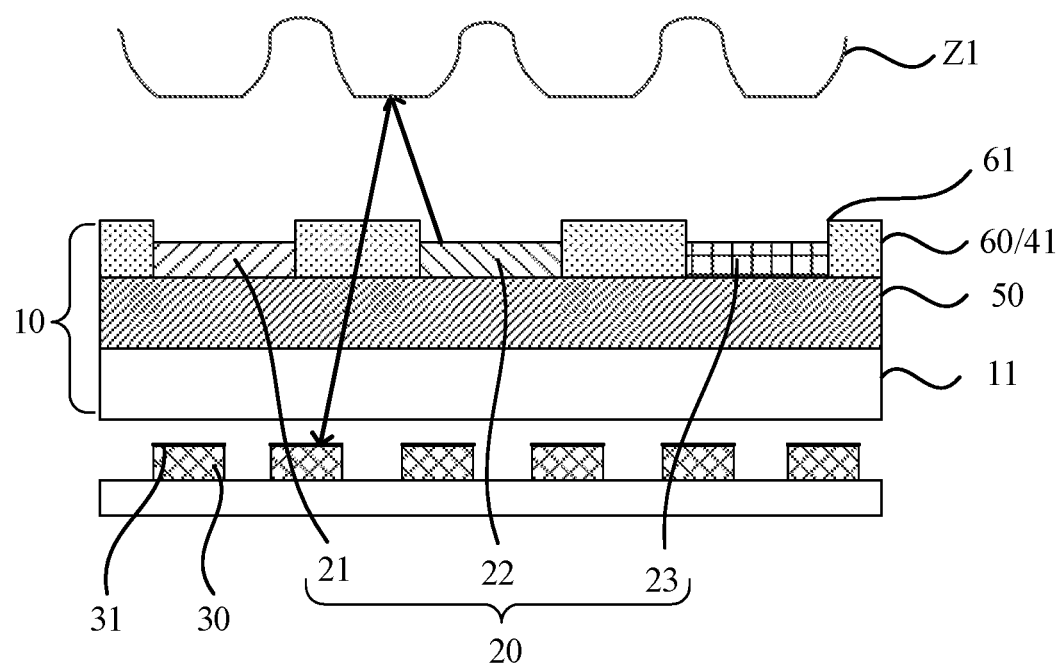
FIG. 7 is a schematic cross sectional view of another display panel according to an embodiment of the present invention.

FIG. 7 is a schematic cross sectional view of another display panel according to an embodiment of the present invention. As shown in FIG. 4 and FIG. 7, the array substrate 10 includes a planarization layer 50 and a pixel defining layer 60, wherein the pixel defining layer 60 has a plurality of grooves 61, and the organic light-emitting structure 20 is located within the groove 61. The pixel defining layer 60 is reused as the first color filter film 41, so that the pixel defining layer 60 can also function as the first color filter film to filter color while having the original function of spacing the organic light-emitting structure 20. An original film layer (pixel defining layer) in the display panel may be used as the first color filter film. To do so, for example, a light-absorbing material may be doped into the existing pixel defining layer, or a material or structure of the present application to perform the color filtering may be used to form the pixel defining layer, so that there is no additional film layer needed to be provided, thereby enabling the display panel to achieve absorption or reflection of ambient light and improve the accuracy of the detection for the fingerprint detection without the increase of the absorption film thickness. On the other hand, since the pixel defining layer is reused as the first color filter film, the manufacturing process of the pixel defining layer and the manufacturing process of the first color filter film are combined in order to further simplify the manufacturing process of the display panel and save the manufacturing process. Also, since the organic light-emitting structures 20 are respectively located in the grooves 61 formed by the pixel defining layer 60, the pixel defining layer 60 and the organic light-emitting structure 20 together form a complete surface, and the ambient light incident from the outside will be filtered by the pixel defining layer reused as the first color filter film, so that it can ensure that the ambient light contained in the light reaching each of the fingerprint recognition units would be filtered by the first color filter film firstly, thus further reducing the adverse effect of ambient light on fingerprint detection.

In other embodiments, the planarization layer may also be configured to be reused as the first color filter film. Referring to FIGS. 4 and 7, the planarization layer 50 may be reused as the first color filter film 41. An original film layer (planarization layer) in the display panel may be used as the first color filter film. To do so, for example, the light-absorbing material may be doped into the existing planarization layer, or a material or structure of the present application to perform the color filtering may be used to form the planarization layer, so that there is no film layer needed to be additionally provided, thereby enabling the display panel to achieve absorption or reflection of ambient light and improve the accuracy of the detection for the fingerprint detection without the increase of the thickness. On the other hand, since the planarization layer is reused as the first color filter film, the manufacturing process of the planarization layer and the manufacturing process of the first color filter film are combined in order to further simplify the manufacturing process of the display panel and save the manufacturing process.

Figure 8:
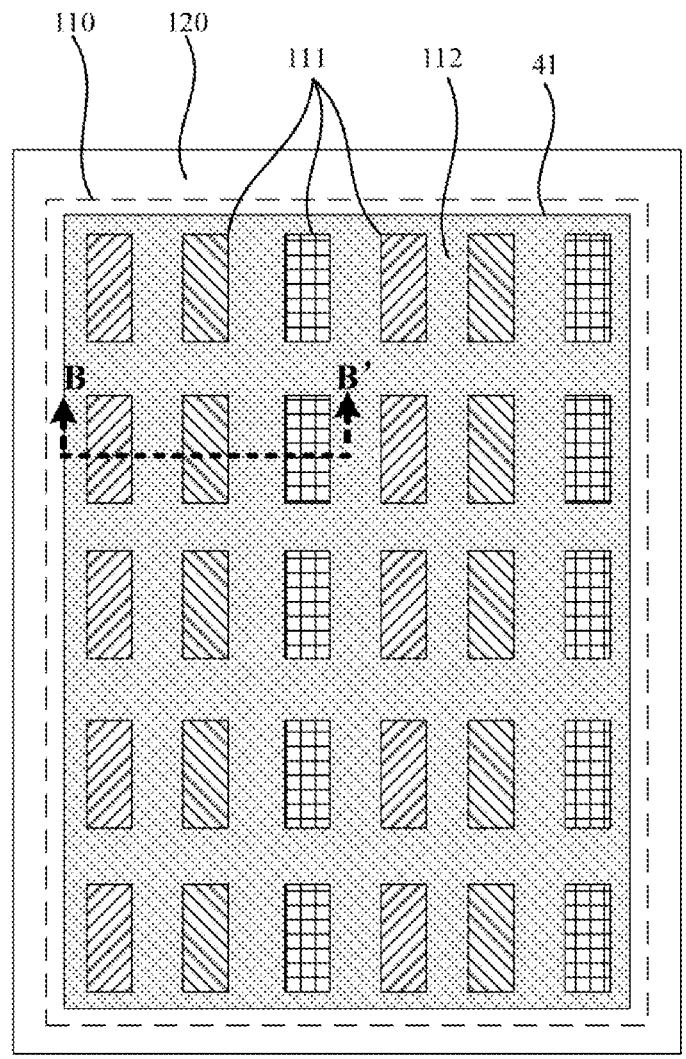
FIG. 8 is a top view showing the structure of another display panel according to an embodiment of the present invention.
Figure 9:
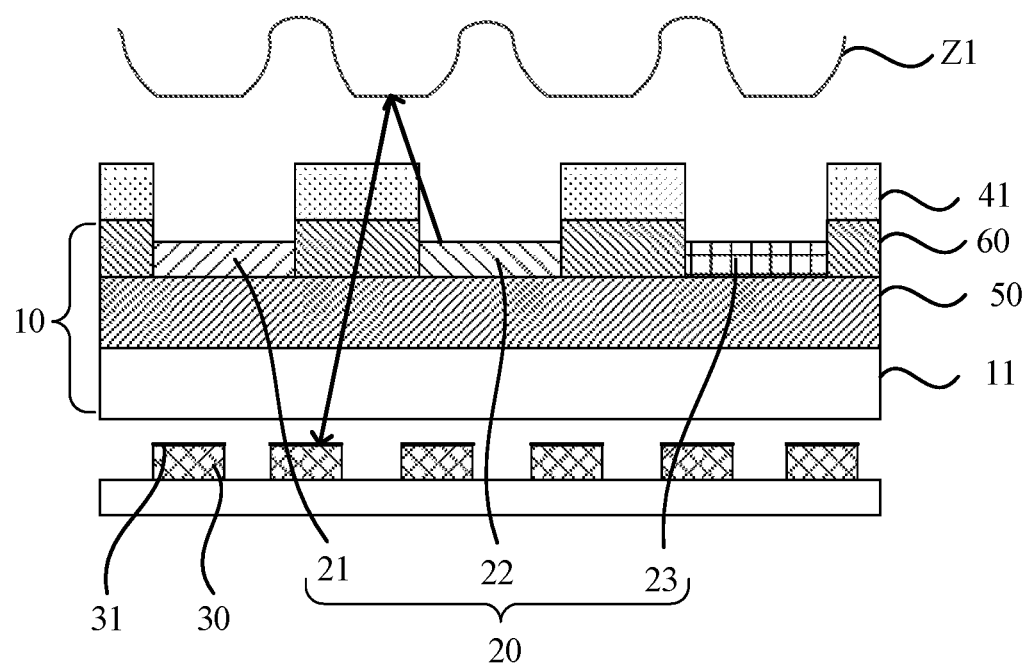
FIG. 9 is a schematic cross sectional view along BB' direction in FIG. 8.

FIG. 8 is a top view showing the structure of another display panel according to an embodiment of the present invention, and FIG. 9 is a schematic cross sectional view along BB' direction in FIG. 8. In combination with FIG. 8 and FIG. 9, a first color filter film 41 covers the opening-free region 112. The first color filter film 41 is located on the light-emitting surface of the plurality of organic light-emitting structures 20, that is, the first color filter film 41 is located on a side of the plurality of organic light-emitting structures 20 away from the base substrate 11. In one embodiment, as shown in FIG. 8, the first color filter film 41 is located on a side of the pixel defining layer 60 away from the base substrate 11, and the first color filter film 41 completely covers the opening-free region 112. In the arrangement that the opening-free region 112 is completely covered by the first color filter film 41, the ambient light radiated to the fingerprint recognition unit 30 can necessarily pass through the first color filter film 41, thereby further reducing adverse effects of ambient light on fingerprint detection. In addition, when the first color filter film 41 is located on the light-emitting surface of the organic light-emitting structure 20, the first color filter film 41 is provided to cover the opening-free region 112 and keep out of the opening region 111, so that the normal light-emitting display function of the display panel is not affected while reducing interference of ambient light to fingerprint recognition. Also, the original manufacturing process of the array substrate and the organic light-emitting structure is not affected, thereby facilitating the design and manufacture. In other embodiments, the first color filter film 41 may also be provided to partly cover the opening-free region 112.

Figure 10:
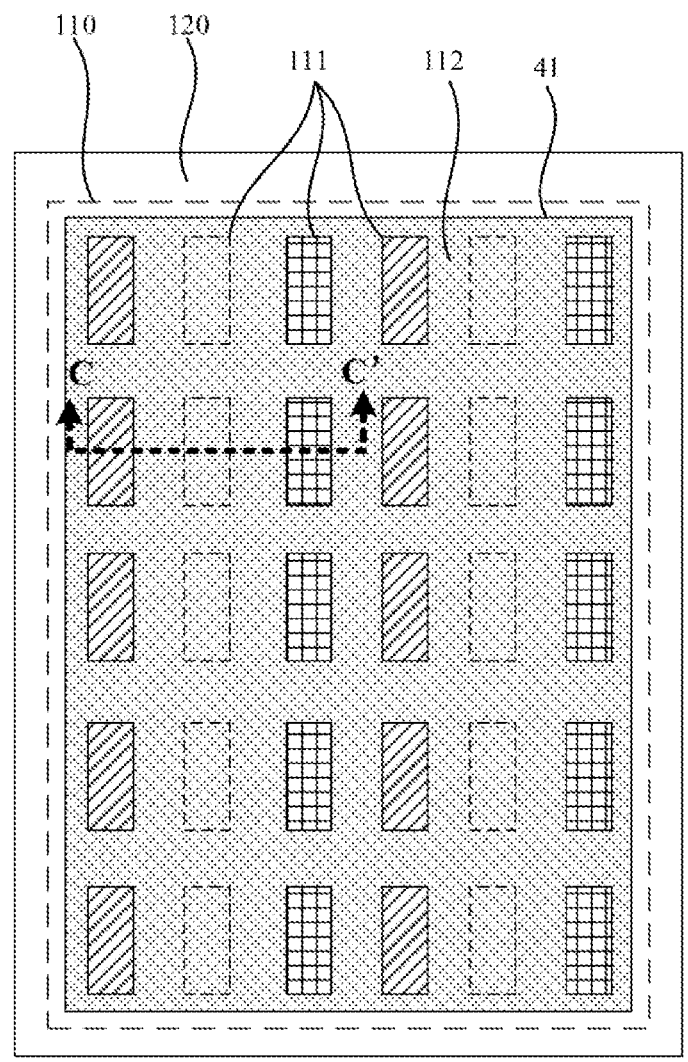
FIG. 10 is a top view showing the structure of another display panel according to an embodiment of the present invention.
Figure 11:
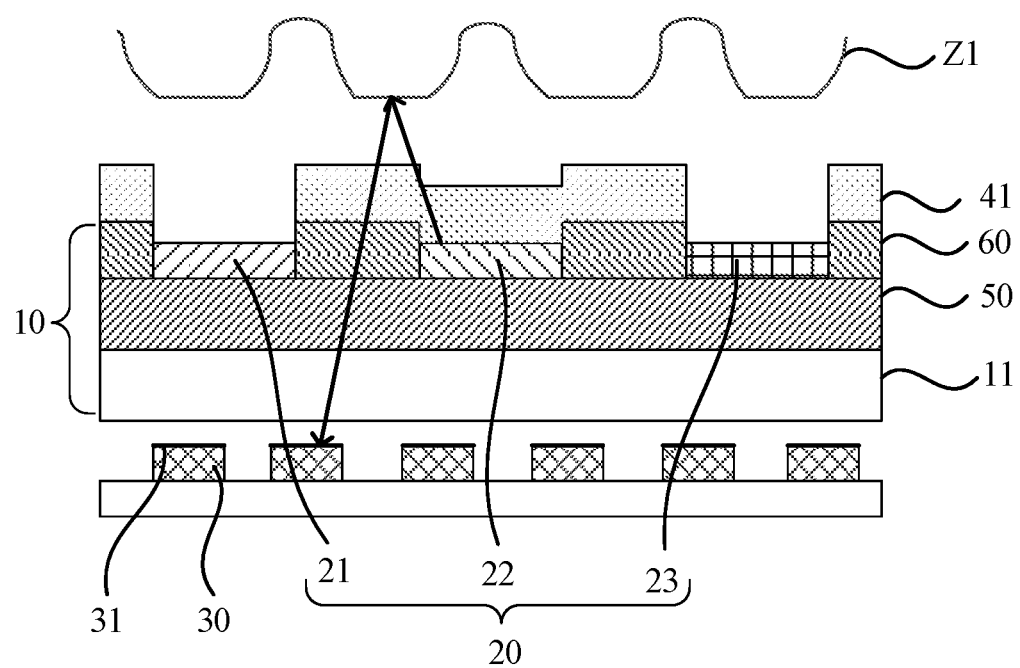
FIG. 11 is a schematic cross sectional view along CC' direction in FIG. 10.

FIG. 10 is a top view showing the structure of another display panel according to an embodiment of the present invention, and FIG. 11 is a schematic cross sectional view along CC' direction in FIG. 10. In combination of FIG. 10 and FIG. 11, the color filter film 41 is located on a side of the light-emitting surface of the plurality of organic light-emitting structures 20. The second organic light-emitting structure 22 functions as a light source of the fingerprint recognition unit 30. The first color filter film 41 covers the opening-free region 112 and also covers the second organic light-emitting structure 22, that is, the first color filter film 41 is also located in the opening region 111 where the second organic light-emitting structure 22 is located, and the spectral range of the emergent light of the second organic light-emitting structure 22 is located within the transmission spectral range of the first color filter film 41. It should be noted that, the emission spectrum of the second organic light-emitting structure 22 is relatively wide, but the light energy thereof is mainly concentrated within one or more optical wave bands. Therefore, the emission spectral range of the second organic light-emitting structure 22 is generally considered to include a wavelength within a certain range centered on the peak wavelength thereof. For example, two wavelengths corresponding to the positions where the light intensity value is half of the light intensity value of the peak wavelength may be taken as the endpoint values of the emission spectral range of the second organic light-emitting structure 22. It can be understood that the emission spectral range of the second organic light-emitting structure 22 may include one or more peak wavelengths, wherein the peak wavelength is a wavelength value corresponding to the peak position in the emission spectrum of the second organic light-emitting structure 22. The wavelength of a part of the light in the emergent light of the second organic light-emitting structure 22 is away from the peak wavelength, and as such, the part of the light exceeds the transmission spectral range of the first color filter film 41 and thus is absorbed or reflected by the first color filter film 41 and is filtered. Due to the filtering effect of the first color filter film 41, the color purity of the emergent light of the second organic light-emitting structure 22 is improved during the light-emitting display. For ease of understanding, for example, the spectrum of the emitted light of the second organic light-emitting structure 22 is relatively wide, for example, 200 nm-1000 nm, and the corresponding light intensity at a wavelength of 531 nm has a maximum value within a wavelength range of 200 nm-1000 nm. In this case, the peak wavelength of the emitted light of the second organic light-emitting structure 22 is 531 nm, and the light intensity corresponding to the wavelengths 511 nm and 551 nm are half of the light intensity corresponding to the peak wavelength 531 nm. Since the dominant intensity of the emergent light of the second organic light-emitting structure 22 is concentrated within 511 nm-551 nm, 511 nm-551 nm are generally used as the emission spectral range of the second organic light-emitting structure 22. If the transmission spectral range of the first color filter film 41 in this case is 500 nm-550 nm, the light having a wavelength of 200 nm-500 nm and 550 nm-1000 nm in the emergent light of the light-emitting structure 22 is absorbed by the first color filter film 41, thus improving the color bandwidth of the emergent light of the second organic light-emitting structure 22 during light-emitting display.

In other embodiments, the first organic light-emitting structure may also be provided as the light source of the fingerprint recognition unit, and the first color filter film covers the first organic light-emitting structure. Or, the first organic light-emitting structure and the second organic light-emitting structure together function as the light source of the fingerprint recognition unit, and the first color filter film covers the first organic light-emitting structure and the second organic light-emitting structure, which is not limited in the present disclosure.

Figure 12:
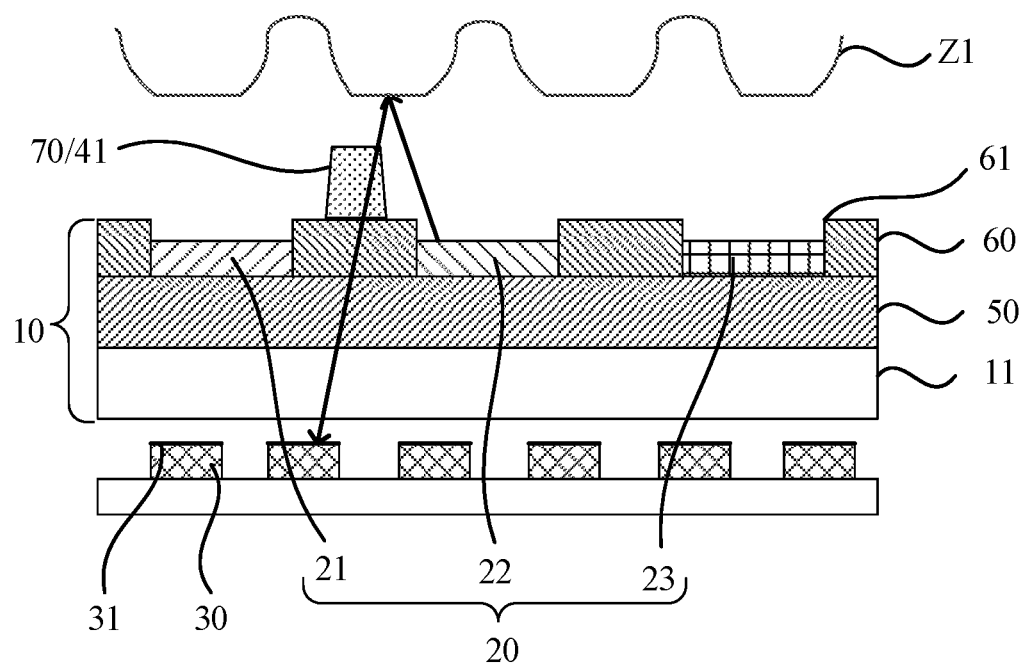
FIG. 12 is a schematic cross sectional view of another display panel according to an embodiment of the present invention.

FIG. 12 is a schematic cross sectional view of another display panel according to an embodiment of the present invention. As shown in FIG. 2, FIG. 4 and FIG. 12, the display panel further includes a supporting column 70 located on a side of the organic light-emitting structure 20 away from the base substrate 11. In one embodiment, the supporting column 70 may be provided on the opening-free region 112, and the supporting column 70 is located on a side of the pixel defining layer 60 away from the base substrate 11 and in contact with the pixel defining layer 60. The first color filter film 41 reuses the supporting column 70. In FIG. 12, one supporting column 70 is exemplarily shown. It can be understood that one supporting column 70 may be provided for every other one or more organic light-emitting structures 20, or one supporting column 70 may be provided between any two adjacent organic light-emitting structures 20, wherein the number and location of supporting columns 70 can be provided according to the requirements of a specific product. An existing film layer (supporting column) in the display panel can be used as the first color filter film. To do so, for example, the light-absorption material can be doped into the existing supporting column, or the material or the structure that can function as the color filter film of the present application can also be used to form the supporting column without adding a new film layer, thereby enabling the display panel to achieve absorption or reflection of the ambient light without the increase of the thickness, and improve the accuracy of the detection for the fingerprint detection.

Figure 13:
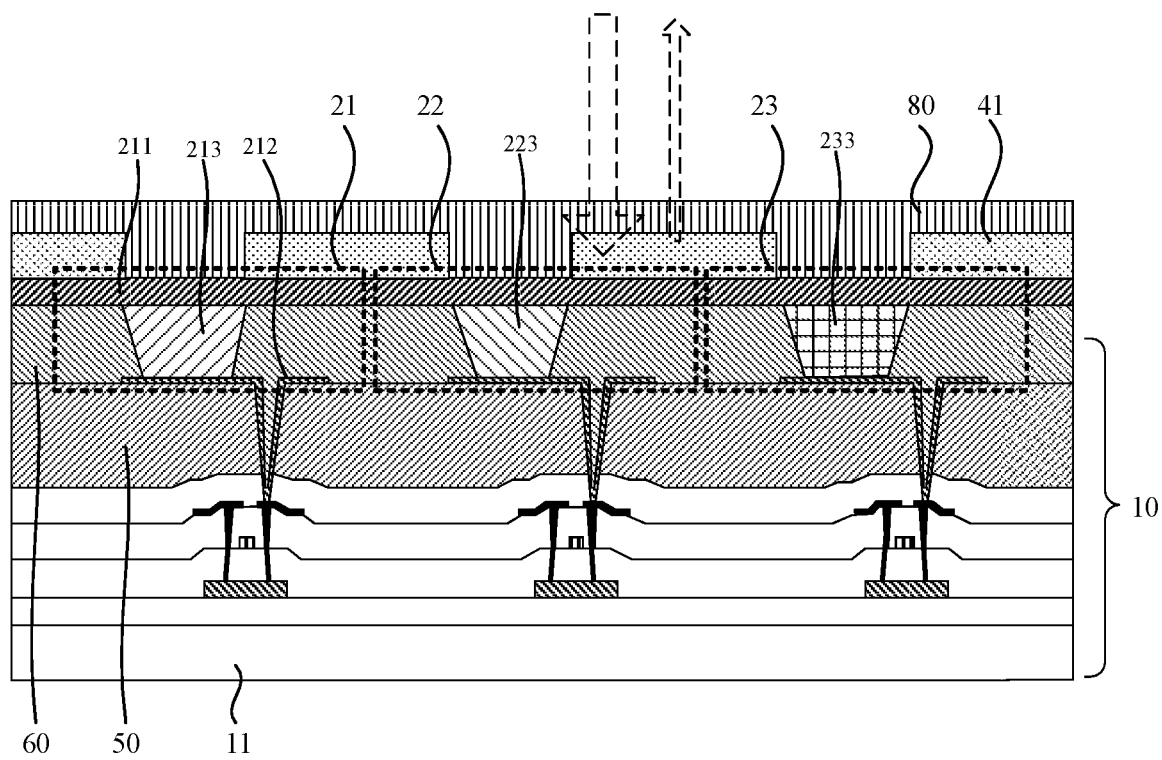
FIG. 13 is a schematic cross sectional view of another display panel according to an embodiment of the present invention.

FIG. 13 is a schematic cross sectional view of another display panel according to an embodiment of the present invention. Referring to FIGS. 2-4 and 13, the display panel further includes a thin film encapsulation layer 80. The thin film encapsulation layer 80 is located on a side of the organic light-emitting structure 20 (including the first organic light-emitting structure 21, the second organic light-emitting structure 22, and the third organic light-emitting structure 23) away from the base substrate 11. The thin film encapsulation layer 80 may include at least one of an organic layer and an inorganic layer, and the thin film encapsulation layer 80 may be provided in a stacked manner for preventing the organic light-emitting structure 20 from being eroded by water and oxygen. The first color filter film 41 is located between the plurality of organic light-emitting structures 20 and the thin film encapsulation layer 80, and the first color filter film 41 is located on the photosensitive surface of the fingerprint recognition unit 30 (not shown in FIG. 13). The ambient light first passes through the first color filter film 41 before reaching the photosensitive surface 31 of the fingerprint recognition unit 30. Therefore, the first color filter film 41 can absorb or reflect the ambient light irradiated onto the fingerprint recognition unit 30 so as to improve the accuracy of the detection results of the fingerprint recognition. The first color filter film 41 is provided between the organic light-emitting structure 20 and the thin film encapsulation layer 80. In the thickness direction of the display panel, the organic light-emitting structure 20 and the first color filter film 41 are close to each other, so that the normal viewing angle of the display panel is not affected, and the first color filter film 41 can cover completely the opening-free region 112 so as to better absorb or reflect the ambient light. Furthermore, the first color filter film is located on a side of the organic light-emitting structure away from the array substrate, so that it would not affect the original process of the array substrate and the organic light-emitting structure, thereby making it easy to design and produce. In addition, in the related art, after the ambient light (indicated by the downward pointing arrow in FIG. 13) is irradiated onto the first electrode 211, a large part of the light in the ambient light emit along the direction departing from the display panel after being reflected by the first electrode 211, resulting in glare phenomenon, which affects the display effect of the display panel. In the embodiments of the present invention, the first color filter film is located between the thin film encapsulation layer and the organic light-emitting structure, and the first color filter film absorbs or reflects a part of the ambient light irradiated on the first electrode, so the light intensity of the ambient light reflected by the first electrode is reduced and hence the display effect of the display panel is improved.

Figure 14:
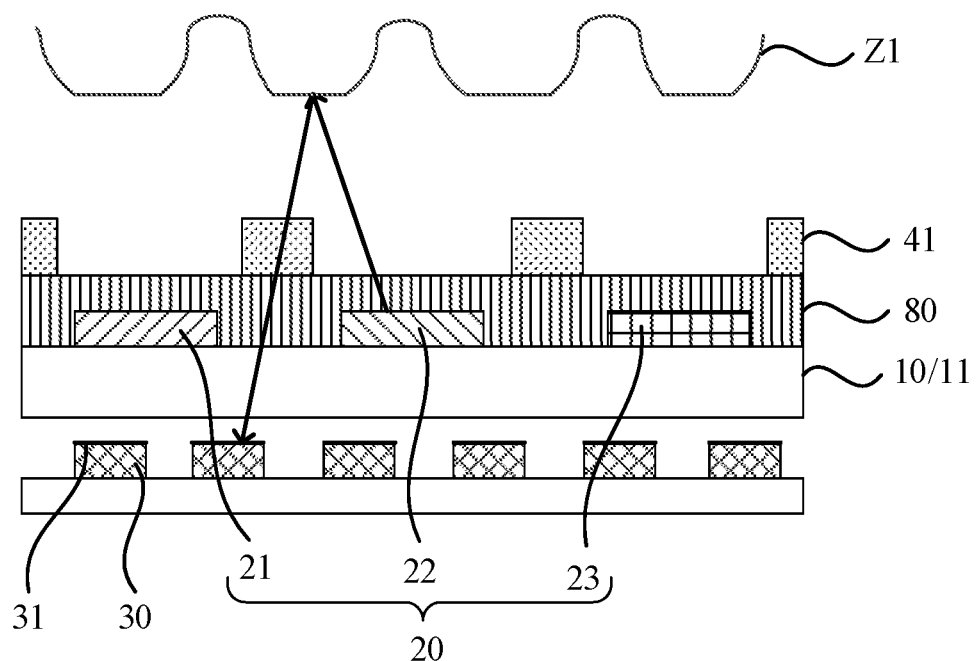
FIG. 14 is a schematic cross sectional view of another display panel according to an embodiment of the present invention.

FIG. 14 is a schematic cross sectional view of another display panel according to an embodiment of the present invention. Referring to FIG. 13 and FIG. 14, the first color filter film 41 may further be provided on a side of the thin film encapsulation layer 80 away from the array substrate 10. Since the first color filter film 41 is located on a side of the organic light-emitting structure 20 away from the array substrate 10, the ambient light radiated to the first electrode 211 (not shown in FIG. 14) of the organic light-emitting structure 20 can be absorbed or reflected by the first color filter film 41. Therefore, this embodiment of the present invention can also improve the display effect of the display panel. Furthermore, the first color filter film can be provided on a side of the thin film encapsulation layer 80 away from the array substrate 10 by way of attaching, so as to simplify the production process. However, since the first color filter film 41 and the organic light-emitting structure 20 are far from each other, light exceeding a certain tilt angle (i.e., light with a large tilt angle) cannot emit to the outside of the display panel during the light-emitting display. In order not to affect the display effect of the display panel, the opening-free region may be partially covered by the first color filter film 41. Exemplarily, the second organic light-emitting structure 22 functions as the light source of the fingerprint recognition unit 30, and the first color filter film 41 is passed through by the light emitted by the second organic light-emitting structure 22 but absorbs or reflects the light emitted by the first organic light-emitting structure 21 and the third organic light-emitting structure 23. Therefore, during the light-emitting display, if the first color filter film 41 is provided on a surface of the thin film encapsulation layer 80 away from the array substrate 10, the organic light-emitting structure 20 has a certain distance from the first color filter film, the large-angle light exceeding a certain tilt angle in the first organic light-emitting structure 21 and the third organic light-emitting structure 23 will be absorbed or reflected by the first color filter film 41 when emitting, and the opening-free region may be partly covered by the first color filter film 41.

Figure 15:
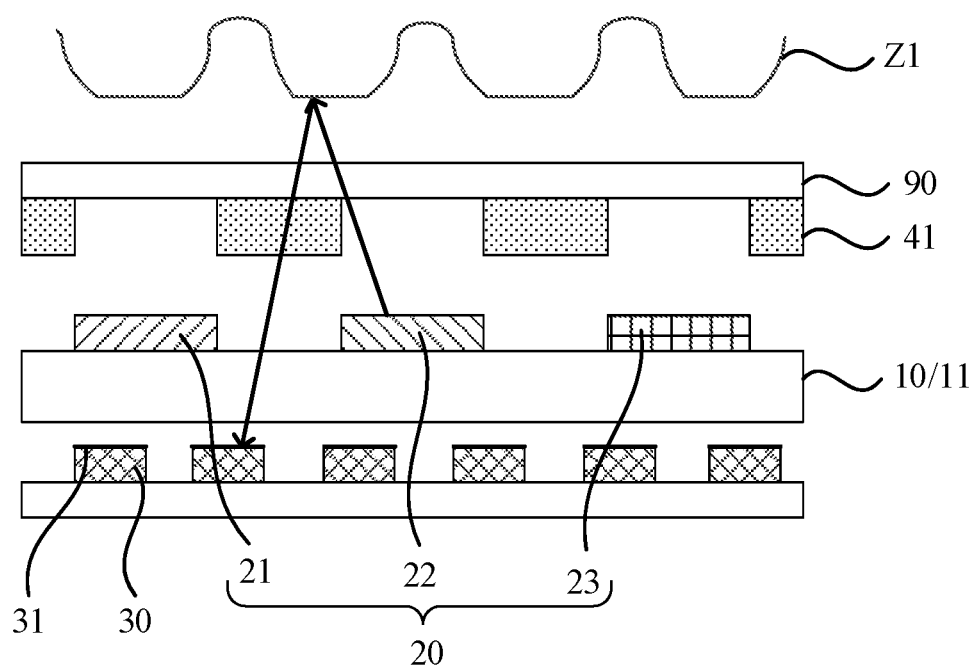
FIG. 15 is a schematic cross sectional view of another display panel according to an embodiment of the present invention.

FIG. 15 is a schematic cross sectional view of another display panel according to an embodiment of the present invention. Unlike the flexible encapsulation used by the display panel shown in FIG. 14, a rigid encapsulation may also be used by the display panel. Referring to FIGS. 13 and 15, the display panel may further include an encapsulation cover plate 90, wherein the encapsulation cover plate 90 may be a glass substrate, and the encapsulation cover plate 90 is provided opposite to the array substrate 10. A frame sealing glue (not shown in FIG. 15) may further be provided between the encapsulation cover plate 90 and the array substrate 10, the encapsulation cover plate 90 and the array substrate 10 are bonded and fixed by the frame sealing glue. The first color filter film 41 is located on a surface of the encapsulation cover plate 90 close to the array substrate 10. Since the first color filter film 41 is located on a side of the organic light-emitting structure 20 away from the array substrate 10, the ambient light irradiated to the first electrode 211 (not shown in FIG. 15) of the organic light-emitting structure 20 is absorbed or reflected by the first color filter film 41, and thus, this embodiment of the present invention may also improve the display effect of the display panel. For the formation of the display panel, for example, producing the first color filter film 41 on the encapsulation cover plate 90 may be employed, and then the side of the encapsulation cover plate 90 having the first color filter film 41 may be aligned with and bonded to the array substrate 10. In this case, since the first color filter film 41 is directly formed on the encapsulation cover plate 90, the encapsulation cover plate 90 on which the first color filter film 41 is formed can be discarded when there is a problem of production yield. With respect to discarding the array substrate 10 on which the first color filter film 41 is manufactured when there is the problem of the production yield, the packaging cover plate 90 on which the first color filter film 41 is manufactured is cheaper, and thus the manufacturing cost is saved.

Figure 16:
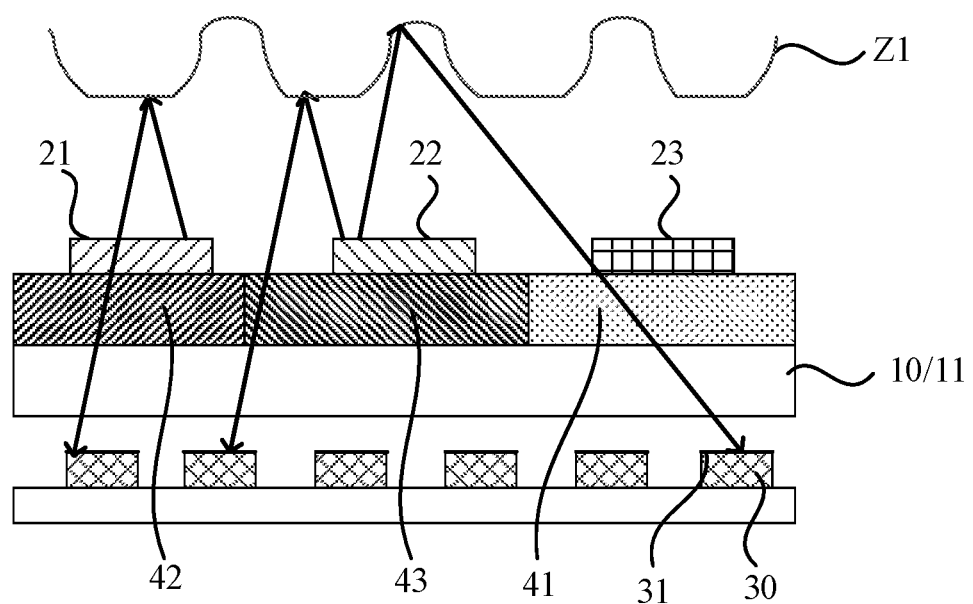
FIG. 16 is a schematic cross sectional view of another display panel according to an embodiment of the present invention.

FIG. 16 is a schematic cross sectional view of another display panel according to an embodiment of the present invention. Unlike only one color filter film as provided in FIG. 2 to FIG. 15, a plurality of color filter films may be further provided, as shown in FIG. 16. The first organic light-emitting structure 21 and the second organic light-emitting structure 22 function as the light source of the fingerprint recognition unit, and the display panel further includes a second color filter film 42 and a third color filter film 43, and the second color filter film 42 and the third color filter film 43 are used for filtering the light reflected by the touch body Z1. The first color filter film 41, the second color filter film 42 and the third color filter film 43 are located in the same layer. The spectral range of the light emitted by the first organic light-emitting structure 21 and the second organic light-emitting structure 22 is located within the transmission spectral range of the first color filter film 41, the spectral range of the light emitted by the first organic light-emitting structure 21 is located within the transmission spectral range of the second color filter film 42, and the spectral range of light emitted by the second organic light-emitting structure 22 is located within the transmission spectral range of the third color filter film 43. The first color filter film 41, the second color filter film 42 and the third color filter film 43 are all located between a plurality of organic light-emitting structures (including the first organic light-emitting structure 21, the second organic light-emitting structure 22 and the third organic light-emitting structure 23) and the fingerprint recognition unit 30, wherein the vertical projection of the third organic light-emitting structure 23 on the base substrate 11 is located within the vertical projection of the first color filter film 41 on the base substrate 11, the vertical projection of the first organic light-emitting structure 21 on the base substrate 11 is located within the vertical projection of the second color filter film 42 on the base substrate 11, and the vertical projection of the second organic light-emitting structure 22 on the base substrate 11 is located within the vertical projection of the third color filter film 43 on the base substrate 11. In this embodiment of the present invention, the second color filter film 42 is provided corresponding to the first organic light-emitting structure 21, the second color filter film 42 is passed through by the light emitted by the first organic light-emitting structure 21, and the light in the ambient light outside the transmission spectral range of the second color filter film 42 is absorbed or reflected by the second color filter film 42; and the third color filter film 43 is provided corresponding to the second organic light-emitting structure 22, the third color filter film 43 is passed through by the light emitted by the second organic light-emitting structure 22, and the light in the ambient light outside the transmission spectral range of the third color filter film 43 is absorbed or reflected by the third color filter film 43; and the first color filter film 41 is provided corresponding to the third organic light-emitting structure 23, the first color filter film 41 is passed through by both the light emitted by the first organic light-emitting structure 21 and the light emitted by the second organic light-emitting structure 22, wherein the light in the ambient light located outside the transmission spectral range of the first color filter film 41 is absorbed or reflected by the first color filter film 41. Therefore, the second color filter film, the third color filter film and the first color filter film are respectively provided corresponding to the first organic light-emitting structure, the second organic light-emitting structure and the third organic light-emitting structure. Compared with the arrangement of only the first color filter film between the organic light-emitting structure and the fingerprint recognition unit, it has a better effect in absorbing or reflecting the ambient light.

Based on the above embodiments, the first color filter film 41 includes a color resistance or a Bragg reflector. The color resistance functions as the absorption of a light wave of a specific wavelength, and specifically, the color resistance can be formed by adding a light-absorbing substance or a light-absorbing material to a base material. The Bragg reflector is a mirror structure that contains an adjustable multi-layer structure consisting of two optical materials. Since the Bragg reflector has a strong reflection capability, the light in the ambient light located within specific wave band can be reflected by the Bragg reflector and the light having a wavelength within the second spectral range can pass through the Bragg reflector, so as to reduce the adverse effects of ambient light on the fingerprint detection without affecting the transmission of the fingerprint signal light.

In one embodiment, in the fingerprint recognition stage, the first organic light-emitting structure 21 functions as the light source of the fingerprint recognition unit 30, wherein the first spectral range is 597 nm to 629 nm, and the transmission spectral range of the first color filter film 41 is 513 nm to 713 nm. In order to enhance the filtering performance of the first color filter film 41 on the ambient light, the transmission spectral range of the first color filter film 41 may further be set narrower to 563 nm to 663 nm. In another embodiment, in the fingerprint recognition stage, the second organic light-emitting structure 22 functions as the light source of the fingerprint recognition unit 30, wherein the first spectral range is 511 nm to 551 nm, and the transmission spectral range of the first color filter film 41 is 431 nm to 631 nm. In order to enhance the filtering performance of the first color filter film 41 on the ambient light, the transmission spectral range of the first color filter film 41 may be further set narrower to 481 nm to 581 nm. In another embodiment, in the fingerprint recognition stage, the first organic light-emitting structure 21 and the second organic light-emitting structure 22 both function as light sources of the fingerprint recognition unit 30, wherein the first spectral range is 511 nm to 551 nm and 597 nm to 629 nm, and the transmission spectral range of the first color filter film 41 is 431 nm to 713 nm. In order to enhance the filtering performance of the first color filter film 41 on the ambient light, the transmission spectral range of the first color filter film 41 may be further set narrower to 481 nm to 663 nm.

Optionally, the first organic light-emitting structure 21 is a red organic light-emitting structure, wherein the red organic light-emitting structure emits red light. The second organic light-emitting structure 22 is a green organic light-emitting structure, wherein the green organic light-emitting structure emits green light. The third organic light-emitting structure 23 is a blue organic light-emitting structure, wherein the blue organic light-emitting structure emits blue light. The red organic light-emitting structure, the green organic light-emitting structure and the blue organic light-emitting structure can be used together to achieve the purpose of color display. The spectral range of light emitted by the red organic light-emitting structure can be 597 nm to 629 nm, the spectral range of light emitted by the green organic light-emitting structure can be 511 nm to 551 nm, and the spectral range of light emitted by the blue organic light-emitting structure can be 451 nm to 473 nm.

Figure 17:
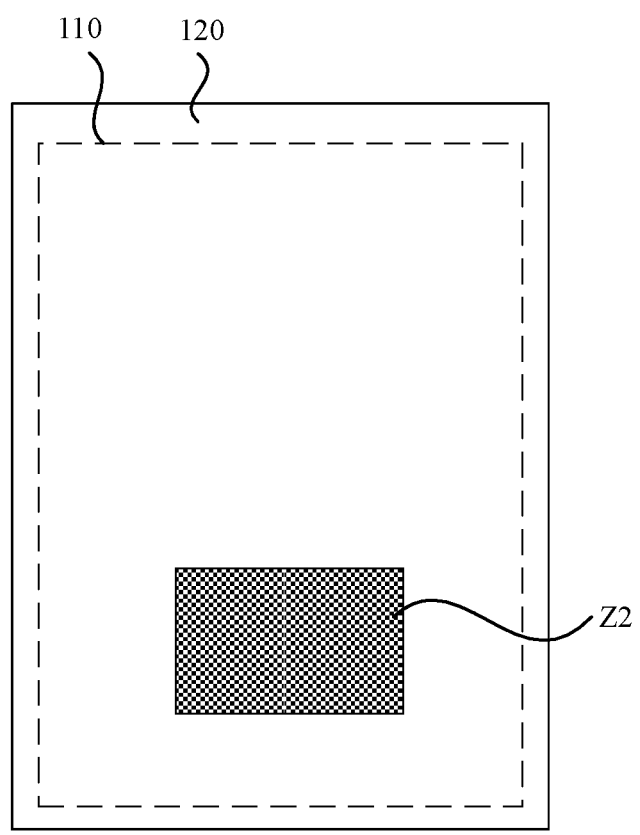
FIG. 17 is a top view showing the structure of another display panel according to an embodiment of the present invention.

FIG. 17 is a top view showing the structure of another display panel according to an embodiment of the present invention. Referring to FIGS. 3 and 17, the display panel includes a display region 110 and a surrounding region 120 surrounding the display region 110. The display panel further includes a fingerprint recognizer Z2 located in the display region 110. Each fingerprint recognizer Z2 includes a plurality of fingerprint recognition units 30. The fingerprint recognizer Z2 can be attached to the outside of the existing display panel having no fingerprint recognition function, or provided to the inside of the existing display panel having no fingerprint recognition function, wherein the fingerprint recognizer Z2 shown in FIG. 17 only occupies a partial region of the display region 110. It can be understood that in the fingerprint recognition stage, the first organic light-emitting structure and/or the second organic light-emitting structure in the region correspond to the fingerprint recognizer Z2 function as the light source of the fingerprint recognition unit, that is, other regions in the display region are not affected during the picture display when the fingerprint recognition is performed. In other embodiments, a fingerprint recognizer may also be provided to occupy the entire display region. The location of the fingerprint recognizer shown in FIG. 17 is just a schematic representation, the location of the fingerprint recognizer may be determined according to the specific implementation. In FIG. 17, the number of fingerprint recognizer is one, and in other embodiments, a plurality of fingerprint recognizers may also be provided in the display region, which is not limited in the present disclosure.

Figure 18:
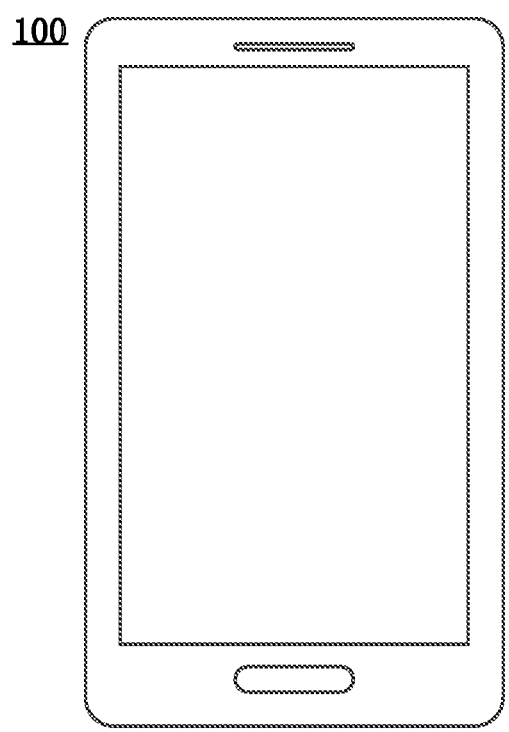
FIG. 18 is a schematic representation of an electronic hand held device.

An embodiment of the present invention further provides an electronic device. FIG. 18 is a schematic structural representation of an electronic handheld device. As shown in FIG. 18, an electronic device 100 includes the display panel claimed in any above embodiment of the present invention, and may be a mobile phone as shown in FIG. 18, it may also be a computer, a television, a smart wearable device, or the like, which is not specifically limited in this embodiment.

Note that the above is only the preferred embodiment of the present invention and the applied technical principles. Those skilled in the art should understand that the present disclosure is not limited to the specific embodiments described herein, and various obvious changes, readjustments, combinations and alternations can be made by those skilled in the art without departing from the scope of the present disclosure. Therefore, although the present disclosure has been described in detail by way of the above embodiments, the present disclosure is not limited only to the above embodiments, and more other equivalent embodiments may be included without departing from the concept of the present disclosure, and the scope of the present disclosure is determined by the scope of the appended claims.

What is claimed is:

1. A display panel, comprising:
an array substrate, comprising a base substrate;
a plurality of organic light-emitting structures located on a side of the array substrate, wherein the plurality of organic light-emitting structures comprises a first organic light-emitting structure, a second organic light-emitting structure and a third organic light-emitting structure;
a fingerprint recognition unit having a photosensitive surface, configured to perform fingerprint recognition based on light reflected by a touch body, wherein an orientation of the photosensitive surface of the fingerprint recognition unit is the same as an orientation of a display surface of the display panel; and
a first color filter film disposed on the fingerprint recognition unit, wherein the light reflected via the touch body reaches the fingerprint recognition unit after passing through the first color filter film;
wherein in a fingerprint recognition stage, wherein at least one of the first organic light-emitting structure and the second organic light-emitting structure functions as a light source of the fingerprint recognition unit;
wherein light emitted from the light source is in a first spectral range, wherein light transmitted through the first color filter film is in a second spectral range, and a third spectral range comprises visible light and near-infrared light; and
wherein the first spectral range is included within the second spectral range, wherein the second spectral range is included within the third spectral range,
wherein at least a part of a wave band of light located within the third spectral range and outside the second spectral range is absorbed or reflected by the first color filter film.

2. The display panel as claimed in claim 1, wherein the fingerprint recognition unit is located on an opposite side than the plurality of organic light-emitting structures on the base substrate.

3. The display panel as claimed in claim 2,
wherein the display panel further comprises an optical imaging layer, between the base substrate and the fingerprint recognition unit, wherein the optical imaging layer covers the fingerprint recognition unit; and
wherein the optical imaging layer is configured to image the light reflected off the touch body onto the photosensitive surface.

4. The display panel as claimed in claim 1, wherein the first color filter film is located between the plurality of organic light-emitting structures and the fingerprint recognition unit.

5. The display panel as claimed in claim 4,
wherein the array substrate further comprises a planarization layer and a pixel defining layer,
wherein the pixel defining layer comprises a plurality of grooves, wherein the plurality of organic light-emitting structures each are located within one of the plurality of grooves; and
wherein one of the pixels defining layer and the planarization layer shares the first color filter film.

6. The display panel as claimed in claim 4, wherein
the first color filter film is a layer film without patterning.

7. The display panel as claimed in claim 1, further comprising a display region and a surrounding region, wherein the display region comprises a plurality of openings, wherein the plurality of organic light-emitting structures is located inside the plurality of openings, and wherein the first color filter film is arranged outside the plurality of openings.

8. The display panel as claimed in claim 7, wherein
the first color filter film is located on a light-emitting surface of the plurality of organic light-emitting structures.

9. The display panel as claimed in claim 8,
wherein the first organic light-emitting structure functions as a light source of the fingerprint recognition unit wherein the first color filter film covers the first organic light-emitting structure, or
wherein the second organic light-emitting structure functions as a light source of the fingerprint recognition unit wherein the first color filter film covers the second organic light-emitting structure, or
the first organic light-emitting structure and the second organic light-emitting structure function as a light source of the fingerprint recognition unit wherein the first color filter film covers the first organic light-emitting structure and the second organic light-emitting structure.

10. The display panel as claimed in claim 7, wherein
the display panel further comprises a supporting column located at a side of the organic light-emitting structure away from the base substrate, and wherein the supporting column shares the first color filter film.

11. The display panel as claimed in claim 7, wherein
the display panel further comprises a thin film encapsulation layer, and wherein the first color filter film is located between the plurality of organic light-emitting structures and the thin film encapsulation layer.

12. The display panel as claimed in claim 7, wherein the display panel further comprises a thin film encapsulation layer, and wherein the first color filter film is located on the surface of the thin film encapsulation layer away from the array substrate.

13. The display panel as claimed in claim 7, wherein the display panel further comprises a encapsulation cover plate, and the first color filter film is located on the surface of the encapsulation cover plate close to the array substrate.

14. The display panel as claimed in claim 1,
wherein sum of the first organic light-emitting structure and the second organic light-emitting structure functions as a light source of the fingerprint recognition unit;
wherein the display panel further comprises a second color filter film and a third color filter film for filtering light reflected from the touch body;
wherein the first color filter film, the second color filter film and the third color filter film are located in the same color filter film layer;
a spectral range of the light emitted by the first organic light-emitting structure is located within a transmitted spectral range of the second color filter film, and a spectral range of the light emitted by the second organic light-emitting structure is located within a transmitted spectral range of the third color filter film;
wherein the first color filter film, the second color filter film and the third color filter film are all located between the plurality of organic light-emitting structures and the fingerprint recognition unit; and
wherein a projection of the third organic light-emitting structure on the base substrate is located inside a projection of the first color filter film on the base substrate, a projection of the first organic light-emitting structure on the base substrate is located inside a projection of the second color filter film on the base substrate, and a projection of the second organic light-emitting structure on the base substrate is located inside a projection of the third color filter film on the base substrate.

15. The display panel as claimed in claim 1,
wherein the first color filter film comprises a color resistor or a Bragg reflector.

16. The display panel as claimed in claim 1, wherein the first spectral range is 597 nm to 629 nm, and the transmitted spectral range of the first color filter film is 513 nm to 713 nm.

17. The display panel as claimed in claim 1, wherein the first spectral range is 511 nm to 551 nm, and the transmitted spectral range of the first color filter film is 431 nm to 631 nm.

18. The display panel as claimed in claim 1, wherein in the fingerprint recognition stage, the first organic light-emitting structure and the second organic light-emitting structure combined functions as a light sources of the fingerprint recognition unit, wherein the first spectral range is 511 nm to 551 nm and 597 nm to 629 nm, and the transmission spectral range of the first color filter film is 431 nm to 713 nm.

19. The display panel as claimed in claim 1, wherein the first organic light-emitting structure is a red organic light-emitting structure, the second organic light-emitting structure is a green organic light-emitting structure, and the third organic light-emitting structure is a blue organic light-emitting structure.

20. An electronic device, comprising a display panel, wherein
the display panel comprises:
an array substrate, comprising a base substrate;
a plurality of organic light-emitting structures located on a side of the array substrate, wherein the plurality of organic light-emitting structures comprises a first organic light-emitting structure, a second organic light-emitting structure and a third organic light-emitting structure;
a fingerprint recognition unit having a photosensitive surface, configured to perform fingerprint recognition based on light reflected by a touch body, wherein an orientation of the photosensitive surface of the fingerprint recognition unit is the same as an orientation of a display surface of the display panel; and
a first color filter film disposed on the fingerprint recognition unit, wherein the light reflected via the touch body reaches the fingerprint recognition unit after passing through the first color filter film;
wherein in a fingerprint recognition stage, wherein at least one of the first organic light-emitting structure and the second organic light-emitting structure functions as a light source of the fingerprint recognition unit;
wherein light emitted from the light source is in a first spectral range, wherein light transmitted through the first color filter film is in a second spectral range, and a third spectral range comprises visible light and near-infrared light; and
wherein the first spectral range is included within the second spectral range, wherein the second spectral range is included within the third spectral range,
wherein at least a part of a wave band of light located within the third spectral range and outside the second spectral range is absorbed or reflected by the first color filter film.

* * * * *